(12) United States Patent
Tanaka et al.

(10) Patent No.: US 9,991,099 B2
(45) Date of Patent: Jun. 5, 2018

(54) FILAMENT HOLDER FOR HOT CATHODE PECVD SOURCE

(71) Applicant: Seagate Technology LLC, Cupertino, CA (US)

(72) Inventors: Samuel Lewis Tanaka, Fremont, CA (US); Christopher L. Platt, Fremont, CA (US); Thomas Larson Greenberg, Berkeley, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 236 days.

(21) Appl. No.: 14/939,659

(22) Filed: Nov. 12, 2015

(65) Prior Publication Data

US 2016/0163517 A1   Jun. 9, 2016

Related U.S. Application Data

(60) Provisional application No. 62/088,345, filed on Dec. 5, 2014.

(51) Int. Cl.
| | |
|---|---|
| *H01J 37/32* | (2006.01) |
| *H01K 1/18* | (2006.01) |
| *C23C 16/26* | (2006.01) |
| *C23C 16/50* | (2006.01) |

(52) U.S. Cl.
CPC ........ *H01J 37/32568* (2013.01); *C23C 16/26* (2013.01); *C23C 16/50* (2013.01); *H01J 37/3233* (2013.01); *H01J 37/3244* (2013.01); *H01J 37/32403* (2013.01); *H01J 37/32449* (2013.01); *H01K 1/18* (2013.01); *H01J 2237/032* (2013.01); *H01J 2237/3321* (2013.01)

(58) Field of Classification Search
CPC ............. H01J 37/32568; H01J 37/3233; H01J 37/32403; H01J 37/3244; H01J 37/32449; H01K 1/18
See application file for complete search history.

(56) References Cited

U.S. PATENT DOCUMENTS

| | | | |
|---|---|---|---|
| 3,366,826 A | * | 1/1968 | Rainone ................... H01K 1/18 313/269 |
| 4,055,780 A | | 10/1977 | Kawai et al. |
| 4,531,077 A | | 7/1985 | Dagenhart |
| 5,169,452 A | | 12/1992 | Nakayama et al. |
| 5,185,067 A | | 2/1993 | Shibahara et al. |
| 6,080,470 A | | 6/2000 | Dorfman |
| 9,111,566 B2 | | 8/2015 | Ota |
| 9,115,426 B2 | | 8/2015 | Kolev et al. |
| 9,117,737 B2 | | 8/2015 | Kalish et al. |

(Continued)

*Primary Examiner* — Anne Hines
(74) *Attorney, Agent, or Firm* — Westman, Champlin & Koehler, P.A.

(57) ABSTRACT

A chemical vapor deposition source that includes at least one plate to which first and second electrical connection posts are coupled. The chemical vapor deposition source also includes a filament having a first end and a second end. The first end of the filament is electrically connected to the first electrical connection post and the second end of the filament is electrically connected to the second electrical connection post. The chemical vapor deposition source further includes at least one filament holder electrically insulated from the at least one plate. The at least one filament holder holds a portion of the filament between the first end and the second end.

15 Claims, 9 Drawing Sheets

(56) References Cited

U.S. PATENT DOCUMENTS

2003/0138645 A1 7/2003 Gleason et al.
2004/0026628 A1 2/2004 Schweikhard et al.
2005/0231096 A1 10/2005 Ishige et al.

* cited by examiner

FILAMENT HOLDER FOR HOT CATHODE PECVD SOURCE

CROSS-REFERENCE TO RELATED APPLICATION

The present application is based on and claims the benefit of U.S. provisional patent application Ser. No. 62/088,345, filed Dec. 5, 2014, the content of which is hereby incorporated by reference in its entirety.

BACKGROUND

Data storage systems commonly have one or more data storage media and one or more elements (for example, read/write heads) that communicate with the data storage media to store and retrieve data. Data storage media may be magnetic storage media, optical storage media, etc. Magnetic storage media such as magnetic discs may comprise a substrate over which a non-magnetic underlayer, a magnetic layer and a protective overcoat are deposited using a suitable technique.

A plasma enhanced chemical vapor deposition (PECVD) technique may be used to deposit the protective overcoat. This technique may employ a deposition source having a filament for emitting electrons.

SUMMARY

The present disclosure relates to filament holders that are capable of restraining/limiting filament movement. Certain embodiments relate to filament holders and other related elements used in a process for depositing a protective overcoat on a data storage medium. In one embodiment, a chemical vapor deposition source that includes at least one plate to which first and second electrical connection posts are coupled is provided. The chemical vapor deposition source also includes a filament having a first end and a second end. The first end of the filament is electrically connected to the first electrical connection post and the second end of the filament is electrically connected to the second electrical connection post. The chemical vapor deposition source further includes at least one filament holder electrically insulated from the at least one plate. The at least one filament holder holds a portion of the filament between the first end and the second end.

Other features and benefits that characterize embodiments of the disclosure will be apparent upon reading the following detailed description and review of the associated drawings.

DETAILED DESCRIPTION OF ILLUSTRATIVE EMBODIMENTS

The disclosure generally relates to filament holders that are capable of restraining/limiting filament movement. Certain embodiments described below relate to filament holders and other related elements used in a process for depositing a protective overcoat on a data storage medium.

A plasma enhanced chemical vapor deposition (PECVD) process may be used to deposit the protective overcoat on the data storage medium. The PEVCD process may employ a deposition source having a filament for emitting electrons. In a particular embodiment, a chemical vapor deposition source, which uses a hot filament cathode capable of emitting electrons by thermionic emission, is utilized in the PEVCD process to deposit a carbon overcoat on a magnetic data storage medium (for example, a magnetic data storage disc).

During operation of the chemical vapor deposition source, the filament may be heated to about 2500 K (degree Kelvin) to produce electrons by thermionic emission in vacuum. The high temperature combined with the force of gravity may result in sagging of the filament. The carbon process may result in uneven carburization of the filament, which combined with the gravitational forces and the inherent stresses created in the filament during its fabrication, may result in distortion of the filament in multiple dimensions.

The carbon (media overcoat) uniformity is directly affected by the shape, position, and carburization of the filament that acts as the primary electron source. Improved protective overcoat uniformity improves both mechanical and electrical performance in a data storage device that includes the magnetic medium by, for example, reducing spacing variations between a read/write head and the medium.

Figure 1A:
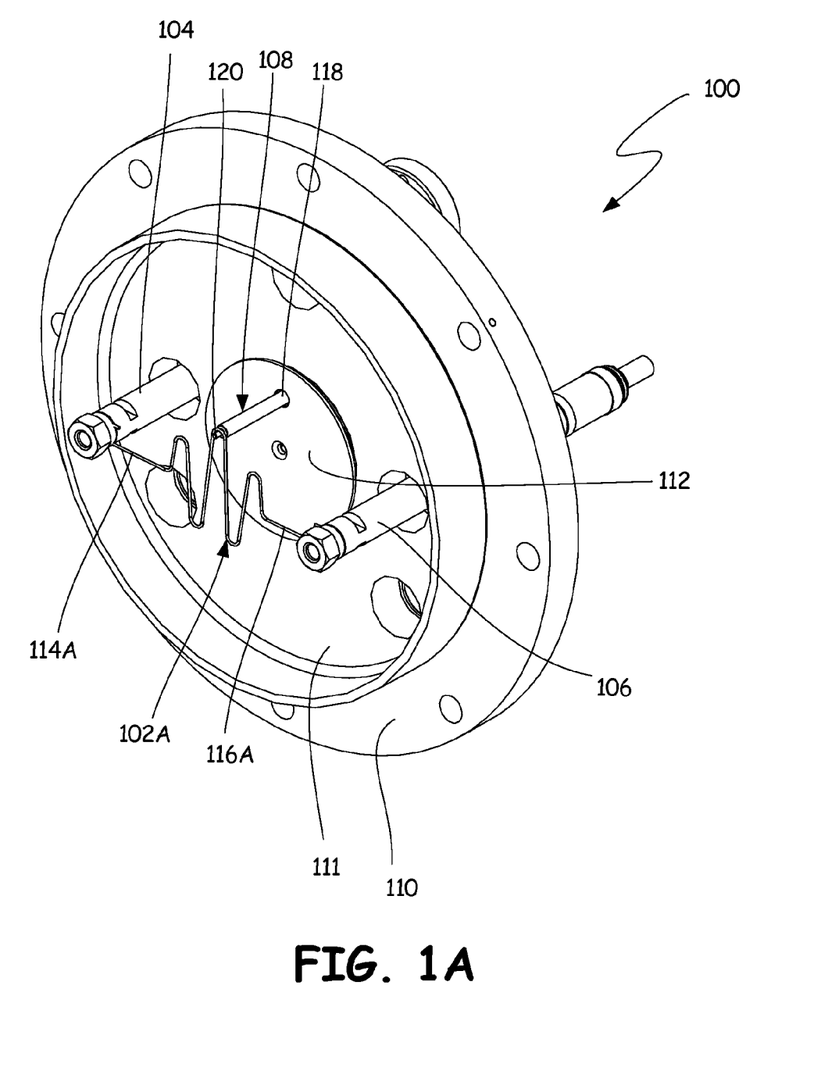
FIG. 1A is a perspective view showing a filament, at least one filament holder and plates of a deposition source in accordance with one embodiment.

FIG. 1A is a perspective view of a portion 100 of a single PECVD source. An entire single PECVD source is described further below in connection with FIG. 2. In the embodiment of FIG. 1A, PECVD source portion 100 includes a filament 102A, electrical connection posts 104 and 106, at least one filament holder 108, and multiple plates including a base plate or rear plate 110, a source shield 111 and a diffuser plate 112.

Filament 102A is a conducting wire with a substantially high melting point. Filament 102A includes a first end 114A and a second end 116A that are electrically connected to posts 104 and 106, respectively. Both first end 114A and second end 116A may be hook shaped or may be of any other suitable shape depending on, for example, a shape/configuration of post 104, 106 to which the filament end 114A, 116A is to be connected. Rear plate 110 is vertically mounted in the PECVD source. Source shield 111 is coupled to the rear plate 110, and diffuser plate 112 may be coupled to source shield 111 via insulating spacers (not shown in FIG. 1A) that are described further below. Electrical connection posts 104 and 106 are mounted on the rear plate 110. Details regarding the rear plate 110 and the diffuser plate 112 are provided further below in connection with FIGS. 2 and 3.

As noted above, the embodiment of FIG. 1A includes filament holder 108. The filament holder 108 includes a fastening portion 118 that couples to a to diffuser plate 112 or to a suitable support member (not shown in FIG. 1A) behind diffuser plate 112. As will be described further below, when coupled to a support structure such as diffuser plate 112, filament holder 108 may be electrically insulated from the source shield 111, which comprises an electrical ground plane of the PECVD source. As can be seen in FIG. 1A, filament holder 108 further includes a holding feature 120 that holds a portion of the filament 102A at a location between the first end 114A and the second end 116A in a manner that prevents deformation of the filament 102A during its service life. Specifically, FIG. 1A shows a single filament holder 108 with the holding feature 120 positioned at a single bend in filament 102A. However, in an alternate embodiment, multiple filament holders 108 with respective holding features 120 positioned at different bends in filament 102A may be employed. It should be noted that, when multiple filament holders 108 are employed, individual ones of the multiple filament holders 108 may be insulated from each other. In general, filament 102A may have any suitable shape, and any suitable number of filament holders may be utilized to hold the filament 102A.

Figure 1B:
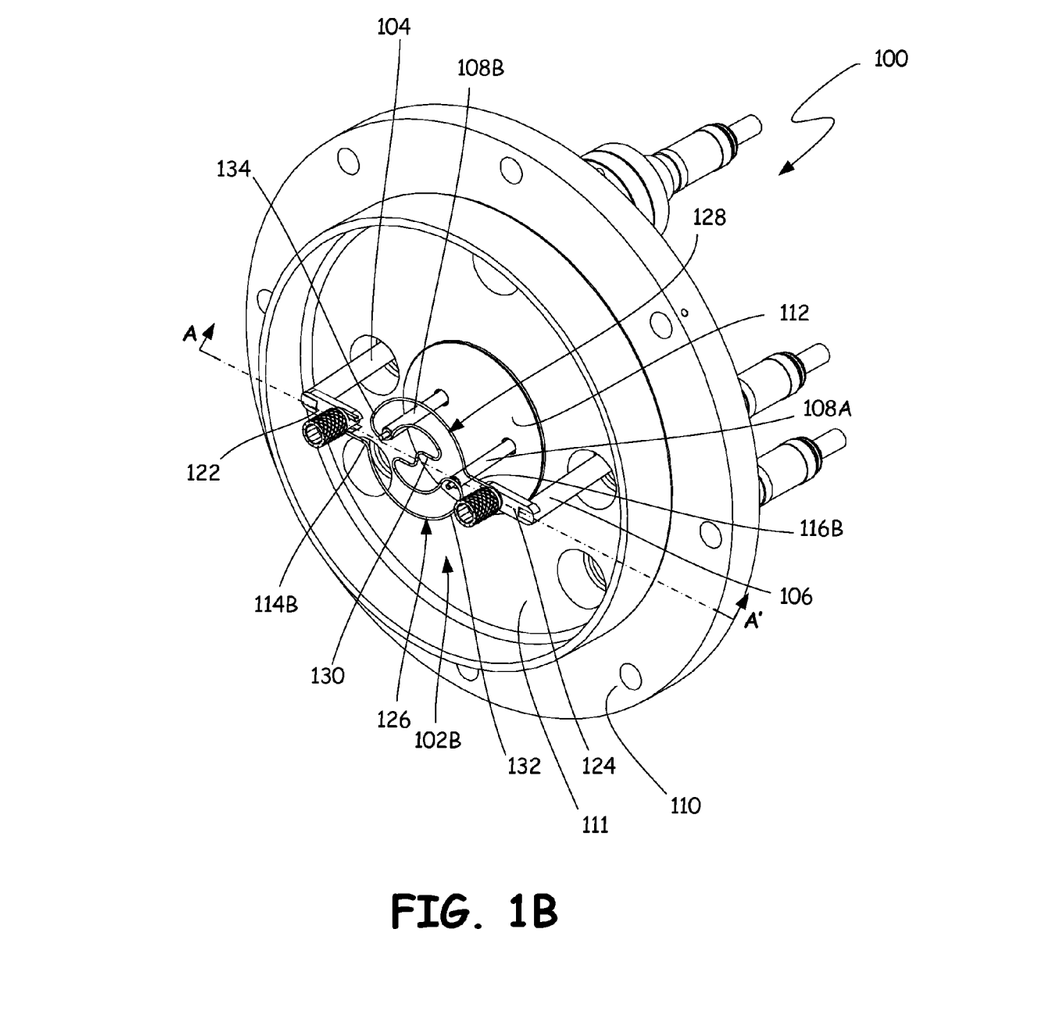
FIG. 1B is a perspective view showing a filament, at least one filament holder and plates of a deposition source in accordance with another embodiment.

FIG. 1B shows a filament 102B that has a shape that is different from the shape of filament 102A. Also, a first end 114B of filament 102B is connected to a first post extender 122 and a second end 116B of filament 102B is connected to a second post extender 124. First post extender 122 is connected to first electrical connection post 104 and second post extender 124 is connected to second electrical connection post 106. Filament 102B includes a first curved arm 126 that extends from the first end 114B and a second curved arm 128 that extends from the second end 116B. The arms 126 and 128 are connected via a central or transition region 130. A first end 132 of first curved arm 126 is held by a first filament holder 108A and a second end 134 of second curved arm 128 is held by a second filament holder 108B. In other respects, the embodiments of FIGS. 1A and 1B are substantially similar and therefore a description of the remaining components of source portion 100 is not repeated in connection with FIG. 1B. It should be noted that filament holders 108A and 108B may be similar to filament holder 108 of FIG. 1A.

Figure 2:
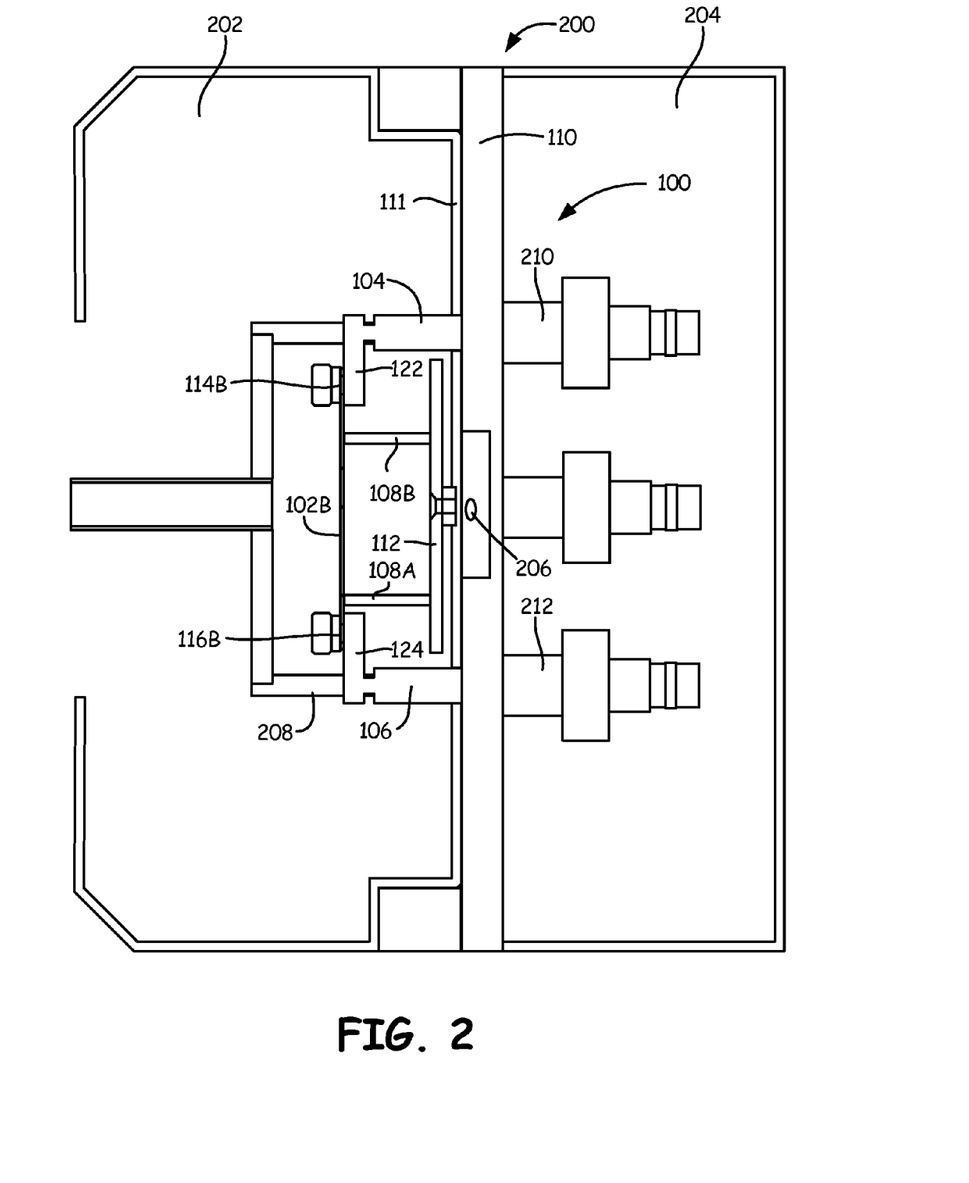
FIG. 2 is a diagrammatic illustration that shows a schematic side sectional view of a single chemical vapor deposition source of a deposition tool.
Figure 3A:
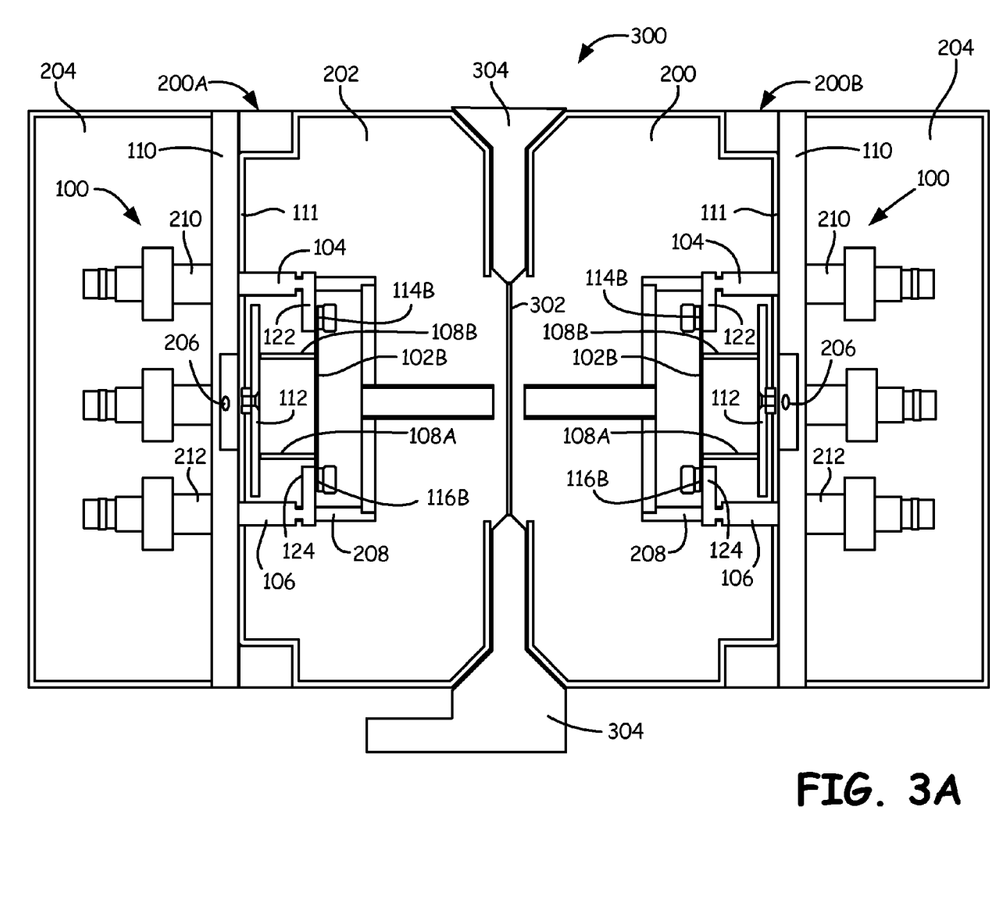
FIG. 3A is a diagrammatic illustration that shows a schematic side sectional view of a deposition tool that includes two chemical vapor deposition sources of the type shown in FIG. 2.

FIG. 2 is a diagrammatic illustration that shows a schematic side sectional view of a single PECVD source 200 of a carbon deposition tool that includes portion 100 shown in FIG. 1B. The side sectional view is along line A-A' of FIG. 1B. PECVD source 200 is capable of depositing a carbon overcoat on one side of a two-sided media disc (not shown in FIG. 2). As can be seen in FIG. 2, PECVD source 200 includes a first portion 202 and a second portion 204. During operation of PECVD source 200, a vacuum is established within first portion 202 and second portion 204 is at atmospheric pressure. First portion 202 is separated from second portion 204 by base plate or rear plate 110 and source shield 111. Base or rear pate 110 includes a gas inlet 206 through which a carbon containing gas (for example, a hydrocarbon gas) is supplied during operation.

First portion or chamber 202 includes the diffuser plate 112 that helps diffuse the gas as it enters the first portion or chamber 202 through the gas inlet 206. Also included in first portion or chamber 200 are an anode 208 and filament 102B (the cathode). As described earlier in connection with FIG. 1B, first end 114B of filament 102B is connected to first post extender 122 and second end 116B of filament 102B is connected to second post extender 124. Also, as described earlier, first post extender 122 is connected to first electrical connection post 104 and second post extender 124 is connected to second electrical connection post 106. Electrical connection posts 104 and 106 and anode 208 are mounted on base or rear plate 110. Electrical feedthroughs 210 and 212 in second portion 204 are connected to base or rear plate 110. As described above in connection with FIG. 1B, first filament holder 108A and second filament holder 108B hold portions of filament 102B. In the interest of simplification, any additional components/elements that may be included in PECVD source 200 are not shown or described.

FIG. 3A is a diagrammatic illustration that shows a schematic side sectional view of a carbon deposition tool 300 that includes first and second PECVD sources 200A and 200B, which are substantially similar to the PECVD source 200 described above in connection with FIG. 2. Therefore, a description of elements of individual sources 200A and 200B is not provided.

Figure 3B:
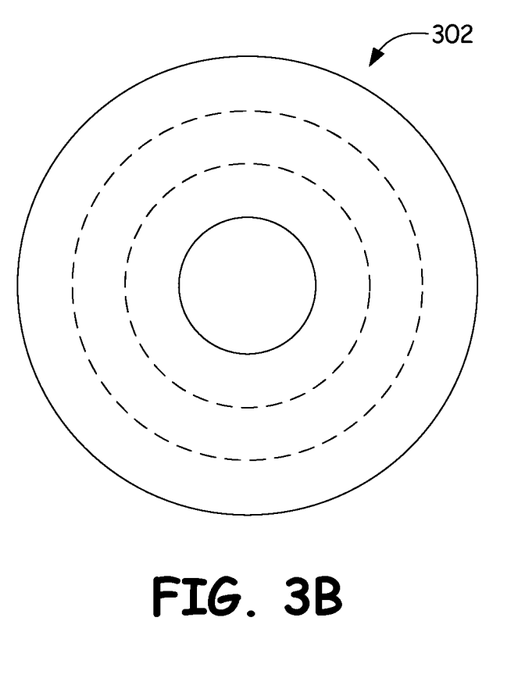
FIG. 3B is a diagrammatic illustration of a surface of a media disc.

A two-sided media disc 302 to be coated with a carbon overcoat on both its sides is held between sources 200A and 200B by a support element 304. In the interest of simplification, details of the support element 304 are not provided. During operation, carbon containing gas is supplied to sources 200A and 200B in a manner described above in connection with FIG. 2. Also, electrical current is run through both filaments 102B in both sources 200A and 200B. The electrical current causes the filaments 102B to heat and emit electrons by thermionic emission. The acceleration of those electrons results in plasma in each of the sources 200A and 200B. Accordingly, in such an embodiment, the carbon material that coats opposing surfaces of two-sided media disc 302 is supplied by emitting electrons by thermionic emission from each PECVD source. One surface of two-sided media disc 302 is shown in FIG. 3B. As indicated above, during such a process, filament holders 108A and 108B hold portions of the filament 102B at suitable locations such that deformation of the filament 102B is prevented. Therefore, by employing filament holders 108A and 108B, the shape of filament 102B may be substantially maintained through its lifetime. FIGS. 4A-7B illustrate different specific embodiments of filament holders.

Figure 4A:
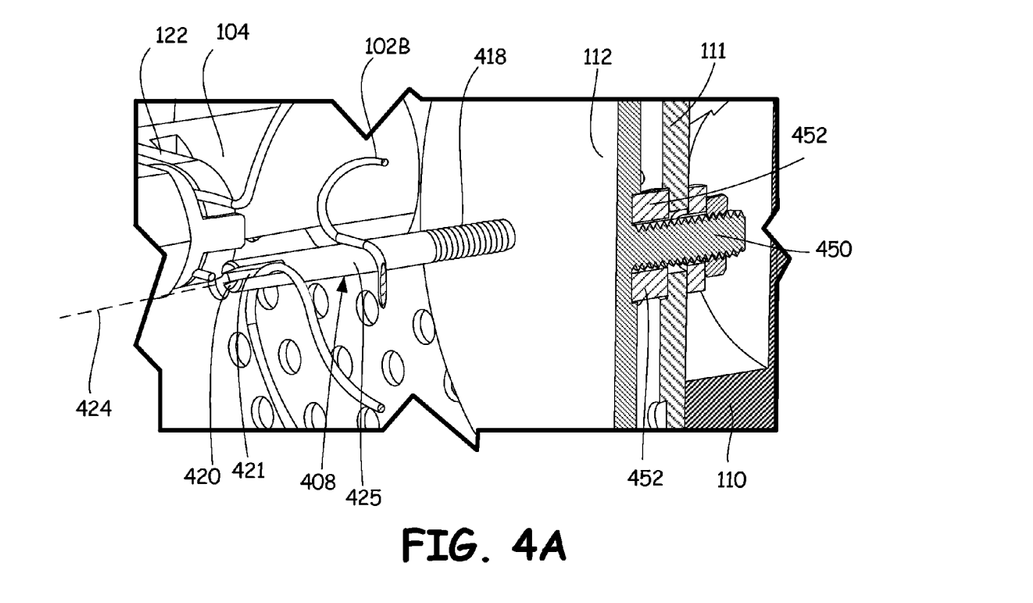
FIG. 4A is a sectional view that shows a filament holder in accordance with one embodiment.
Figure 4B:
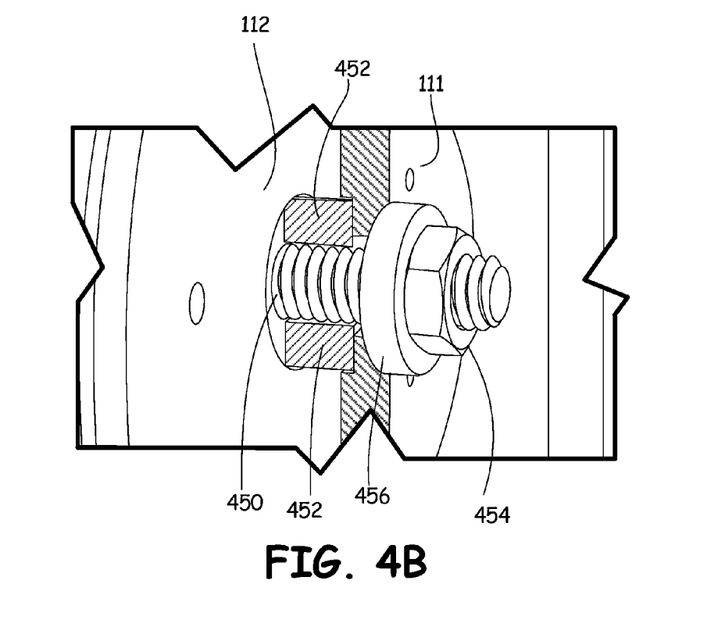
FIG. 4B is diagrammatic illustration showing a mounting of a diffuser plate included in the embodiment of FIG. 4A.

FIG. 4A illustrates a filament holder 408 in accordance with one embodiment. In filament holder 408, holding feature 420 includes a slot 421 that is capable of holding a portion of a filament such a 102B. Fastening portion 418 of filament holder 408 includes threads for securing the filament holder 408 to diffuser plate 112, which includes a corresponding threaded hole (not shown in FIG. 4A) that is sized to receiving the fastening portion 418 of filament holder 408. In the embodiment shown in FIG. 4A, filament holder 408 has a substantially uniform circular cross-section along a height of the filament holder 408 along an axis 424. However, different configurations of filament holder 408 may be used in different embodiments. In one embodiment, filament holder 408 is formed of molybdenum and is electrically isolated from the ground plane of the source (i.e., electrically isolated from source shield 111). In a particular embodiment, the electrical isolation is carried out as shown in FIGS. 4A and 4B by using spacers 452 formed of an insulator (for example, ceramic) to float diffuser plate 112 from its rear side. Specifically, spacers 452 are positioned on sides of a bolt 450 that passes through a hole in source shield 111. The bolt 450 is held in place with the help of nut 454 and washer 456 that are shown in FIG. 4B. During operation, as the filament 102B heats up and expands, it wedges itself into the slot 420 and thus is captured and restrained from moving in all three axes (i.e., x, y and z directions) over its service life. Thus, by capturing the filament 102B from the beginning of its life, its position relative to a substrate is held and maintained to provide a relatively uniform carbon film throughout its service life.

Figure 5A:
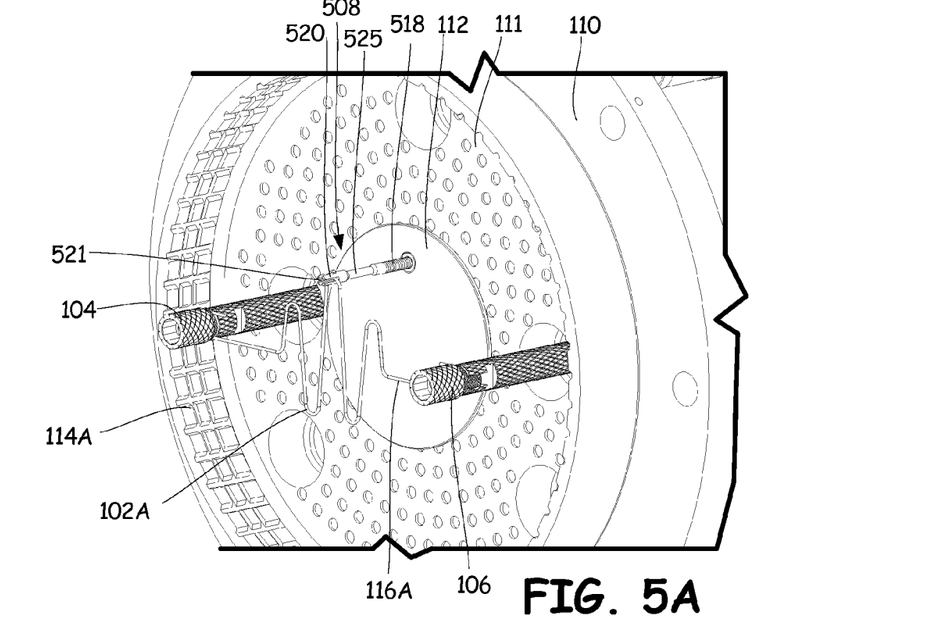
FIGS. 5A and 5B illustrate different views of a filament holder in accordance with another embodiment.
Figure 5B:
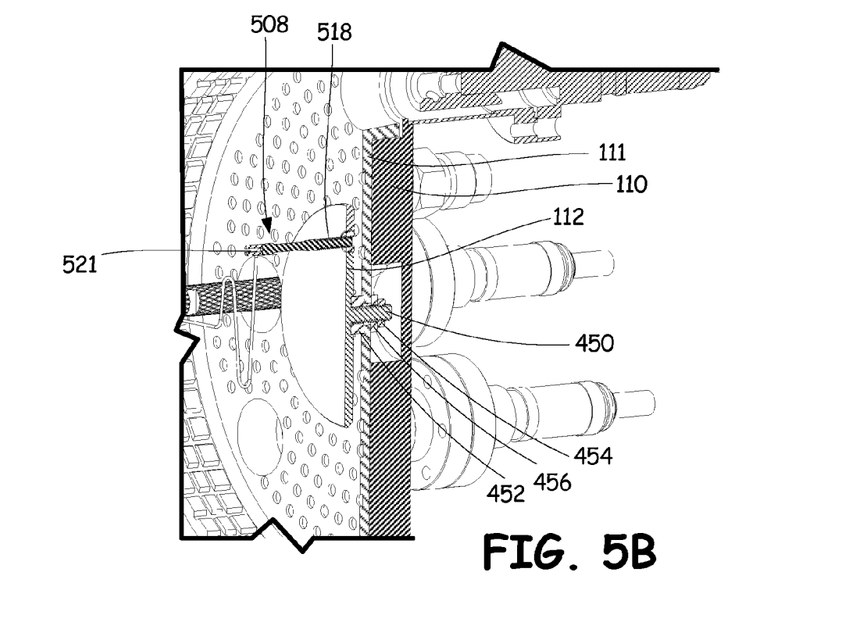

FIG. 5A illustrates a filament holder 508 in accordance with another embodiment. Filament holder 508 may be made of a same material (for example, molybdenum) as filament 408 (of FIG. 4A) in some embodiments. In such embodiments, filament holder 508 is configured to have a mass that is substantially less than a mass of filament holder 408 (of FIG. 4A). The lower mass results in a reduced heat sinking capability of filament holder 508 relative to a heat sinking capability of filament holder 408 (of FIG. 4A). In the embodiment of FIG. 5A, the relatively low-mass filament holder 508 includes a portion 525 that has a substantially lower cross-section than a corresponding portion 425 of filament holder 408 (of FIG. 4A). Also, holding feature 520 is of a substantially similar size as holding feature 420 (of FIG. 4A), but includes multiple slots/grooves 521 and therefore has a reduced mass relative to holding feature 420 (of FIG. 4A), which has a single slot 421. Fastening portion 518 of filament holder 508 is substantially similar to fastening portion 418 (of FIG. 4A). Also, as can be seen in FIG. 5B, filament holder 508 is coupled to diffuser plate 112 in a manner similar to the above-described coupling between filament holder 408 (of FIG. 4A) and diffuser plate 112 shown in FIG. 4A. Also, coupling between diffuser plate 112 and source shield 111 shown in FIGS. 4A and 5B are substantially similar and therefore the description provided in connection with FIG. 4A is not repeated for FIG. 5B.

Figure 6A:
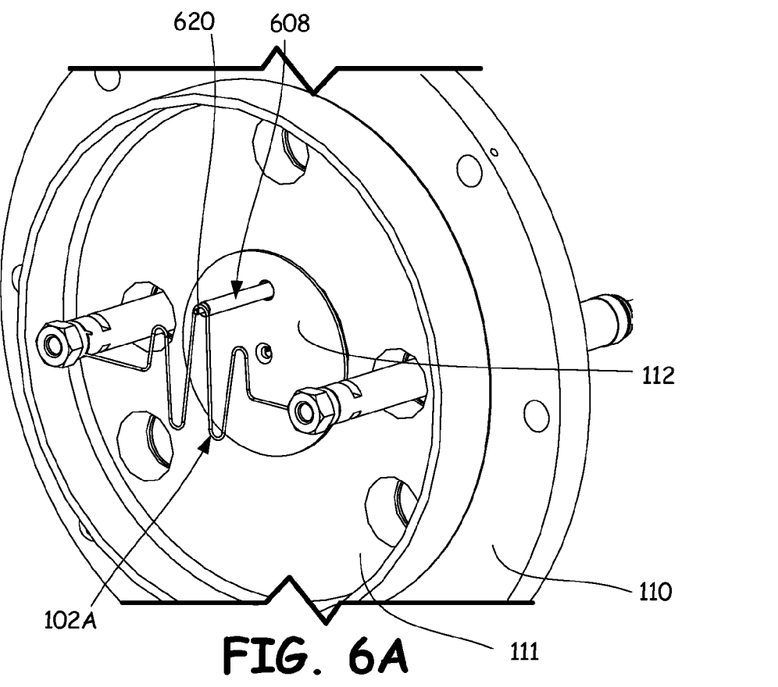
FIGS. 6A and 6B illustrate different views of a filament holder in accordance with yet another embodiment.
Figure 6B:
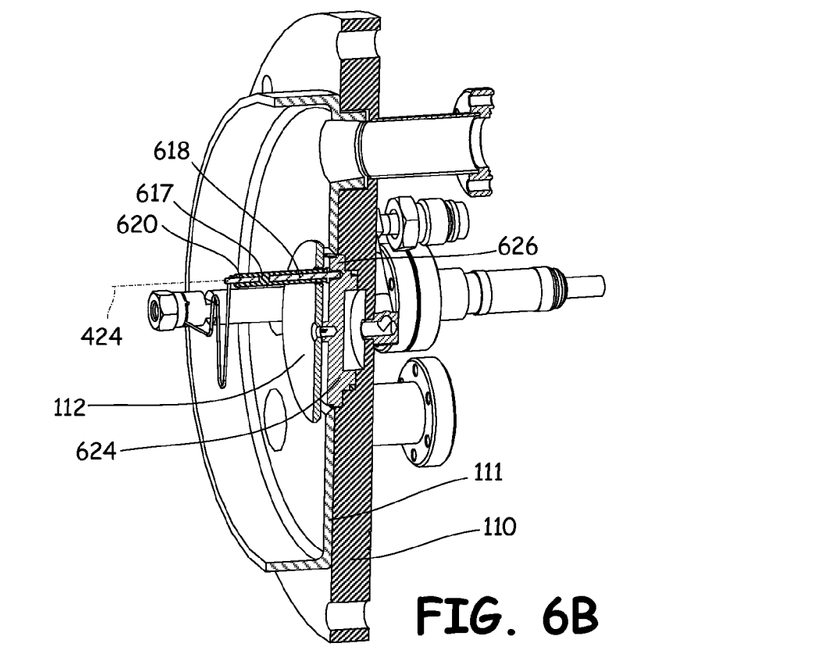

FIGS. 6A and 6B illustrate a filament holder 608 in accordance with yet another embodiment. As can be seen in FIG. 6B, filament holder 608 includes a sleeve 617, a stud 618 and a tip 620. In one embodiment, sleeve 617 is formed of an insulating material (for example, alumina). Stud 618 may be formed of a metal such as stainless steel, and tip 620 may be formed of tungsten or any other suitable material. As can be seen in FIG. 6B, tip 620 may be rod-shaped and may be located at a bent portion of filament 102A. In some embodiment, tip 620 may be a straight rod positioned substantially along, for example, axis 424. In other embodiments, tip 620 may be curved, bent or tilted (i.e., at an angle) from axis 424 to help hold the bent portion of filament 102A in place during operation of the source. As can be seen in FIG. 6B, which is a sectional view of the embodiment shown in FIG. 6A, stud 618 is mounted on an insert 624, which is behind diffuser plate 112 and between diffuser plate 112 and base plate 110. Insert 624, which may be formed of a suitable insulating material, may include, for example, threaded groves 626 that are configured to receive threaded studs 618. It should be noted that, in the embodiment of FIGS. 6A and 6B, sleeve 617 passes through a hole in diffuser plate 112 and therefore diffuser plate 112 is not a part of the heat sink in this embodiment.

Figure 7A:
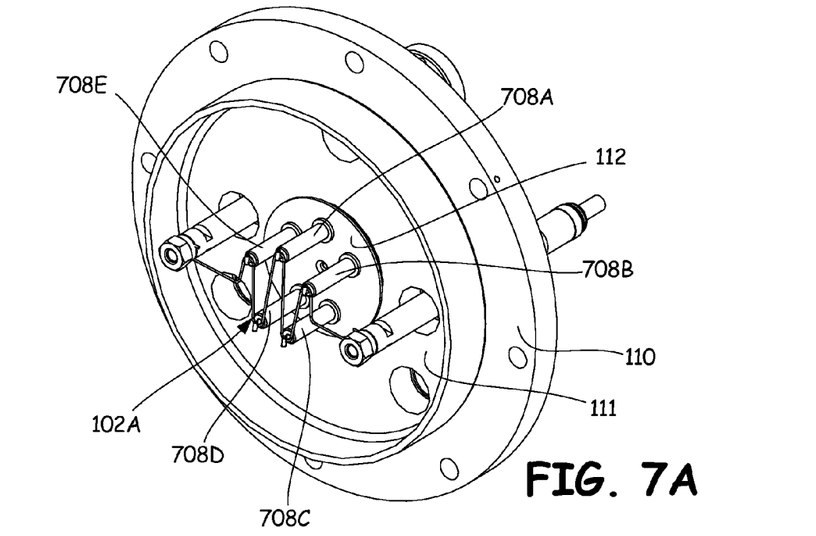
FIGS. 7A and 7B illustrate different views of multiple filament holders in accordance with still another embodiment.
Figure 7B:
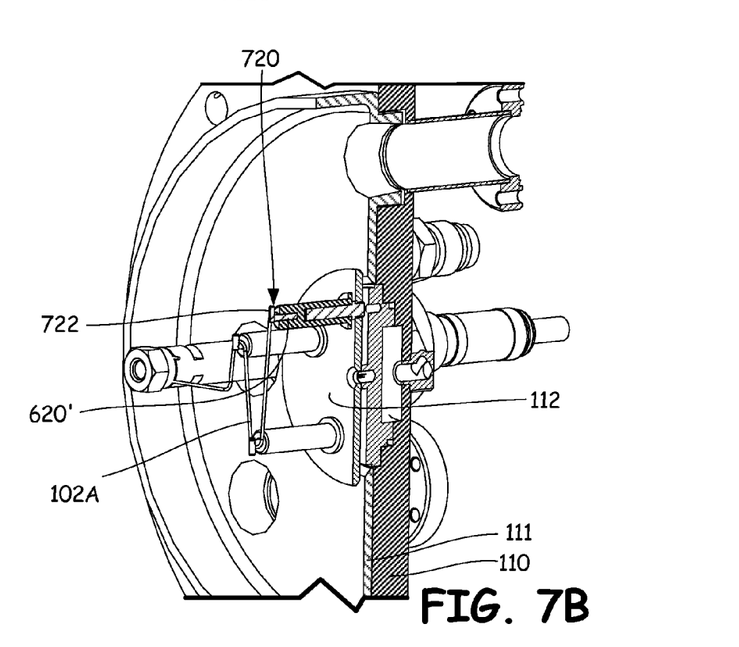

FIGS. 7A and 7B illustrate filament holders 708A-708E in accordance with still another embodiment. In the embodiment shown in FIGS. 7A and 7B, each filament holder 708A, 708B, etc., is similar to filament holder 608 of FIGS. 6A and 6B. However, in addition to including a first tip portion 620', which is similar to tip 620 (of FIGS. 6A and 6B), tip 720 of filament holder 708A, for example, further includes a second tip portion 722 that is at a suitable angle (for example, 90 degrees) to first tip portion 620'. The substantially L-shaped tip 720 helps hold the bent portion of filament 102A in place during operation of the source. Couplings shown in FIGS. 6B and 7B are substantially similar and therefore the description provided in connection with FIG. 6B is not repeated for FIG. 7B. As noted above, since multiple filament holders 708A, 708B, etc., are employed, individual ones of the multiple filament holders 708A, 708B, etc., may be insulated from each other.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:
1. A chemical vapor deposition source comprising:
 at least one plate;
 a gas inlet;
 first and second electrical connection posts coupled to the at least one plate;

an electron-emission filament having a first end and a second end, wherein the first end of the filament is electrically connected to the first electrical connection post and the second end of the filament is electrically connected to the second electrical connection post; and at least one filament holder electrically insulated from the at least one plate, wherein the at least one filament holder is configured to hold a portion of the electron-emission filament between the first end and the second end.

2. The chemical vapor deposition source of claim 1 and wherein the at least one plate comprises a base plate to which the first electrical connection post and the second electrical connection post are coupled, and a source shield coupled to the base plate.

3. The chemical vapor deposition source of claim 2 and further comprising a diffuser plate coupled to the source shield, wherein the source shield is between the base plate and the diffuser plate.

4. The chemical vapor deposition source of claim 3 and wherein the at least one filament holder comprises a holding feature configured to hold the portion of the electron-emission filament between the first end and the second end and a fastening portion configured to couple to the diffuser plate, and wherein the diffuser plate comprises at least one receptacle configured to receive the fastening portion.

5. The chemical vapor deposition source of claim 4 and wherein the diffuser plate is coupled to the source shield via insulating spacers.

6. The chemical vapor deposition source of claim 4 and wherein the holding feature comprises at least one slot configured to receive the portion of the electron-emission filament between the first end and the second end.

7. The chemical vapor deposition source of claim 6 and wherein the filament holder comprises a length, and wherein a cross section of the filament holder is substantially uniform along the length of the filament holder.

8. The chemical vapor deposition source of claim 6 and wherein the filament holder comprise a length, and wherein a cross-section of the filament holder is non-uniform along the length of the filament holder with a relatively small cross-section portion along a part of the length of the filament holder.

9. The chemical vapor deposition of claim of claim 3 and wherein the at least one filament holder comprises a holding feature configured to hold the portion of the electron-emission filament between the first end and the second end and a fastening portion configured to couple to an insert between the diffuser plate and the base plate, and wherein the diffuser plate comprises at least one through hole for the fastening portion to pass through to couple to the insert.

10. The chemical vapor deposition source of claim 9 and wherein the holding feature comprises a rod-shaped tip that is configured to support the portion of the electron-emission filament between the first end and the second end.

11. The chemical vapor deposition source of claim 9 and wherein the holding feature comprises a substantially L-shaped tip that is configured to support the portion of the electron-emission filament between the first end and the second end.

12. The chemical vapor deposition source of claim 4 and wherein the at least one filament holder comprises a plurality of filament holders, and wherein individual ones of the plurality of filament holders are electrically isolated from each other.

13. An apparatus comprising:
a filament holder comprising:
a fastening portion configured to couple to a support structure; and
a holding portion configured to hold a portion of a filament that is between a first electrically coupled end of the filament and a second electrically coupled end of the filament;
a base plate;
first and second electrical connection posts coupled to the base plate, and the first electrically coupled end of the filament is coupled to the first electrical connection post, and the second electrically coupled end of the filament is coupled to the second electrical connection post;
a source shield coupled to the base plate;
a diffuser plate coupled to the source shield; and
the source shield is between the base plate and the diffuser plate, and the diffuser plate comprises the support structure to which the fastening portion of the filament holder is configured to couple; or
an insert is included between the diffuser plate and the base plate, with the insert comprising the support structure, and the fastening portion is configured to couple to the insert between the diffuser plate and the base plate, and the diffuser plate comprises at least one through hole for the fastening portion to pass through to couple to the insert.

14. A plasma enhanced chemical vapor deposition source comprising:
at least one plate that comprises a base plate, a source shield coupled to the base plate, and a diffuser plate coupled to the source shield, the source shield being between the base plate and the diffuser plate; and
at least one filament holder insulatingly coupled to the at least one plate, wherein the at least one filament holder is configured to hold a portion of a filament between a first end of the filament and a second end of the filament.

15. The plasma enhanced chemical vapor deposition source of claim 14 and wherein the at least one filament holder is mounted on the diffuser plate.

* * * * *